US009344656B2

United States Patent
Sumi

(10) Patent No.: US 9,344,656 B2
(45) Date of Patent: May 17, 2016

(54) SOLID-STATE IMAGE SENSOR AND CAMERA SYSTEM

(75) Inventor: Hirofumi Sumi, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 191 days.

(21) Appl. No.: 14/002,307

(22) PCT Filed: Apr. 3, 2012

(86) PCT No.: PCT/JP2012/059069
§ 371 (c)(1),
(2), (4) Date: Dec. 11, 2013

(87) PCT Pub. No.: WO2012/141042
PCT Pub. Date: Oct. 18, 2012

(65) Prior Publication Data
US 2014/0160332 A1 Jun. 12, 2014

(30) Foreign Application Priority Data

Apr. 11, 2011 (JP) ................................. 2011-087333

(51) Int. Cl.
*H04N 5/374* (2011.01)
*H03M 3/00* (2006.01)
(Continued)

(52) U.S. Cl.
CPC .......... *H04N 5/374* (2013.01); *H01L 27/14603* (2013.01); *H01L 27/14609* (2013.01); *H04N 5/357* (2013.01); *H04N 5/3658* (2013.01); *H04N 5/378* (2013.01)

(58) Field of Classification Search
CPC ..... H04N 5/357; H04N 5/3658; H04N 5/374; H04N 5/378; H01L 27/14609; H01L 27/14603
See application file for complete search history.

(56) References Cited

U.S. PATENT DOCUMENTS

| 6,532,040 B1 * | 3/2003 | Kozlowski | H03F 3/087 250/208.1 |
|---|---|---|---|
| 7,023,369 B2 * | 4/2006 | Bocko et al. | 341/143 |
| 2005/0073451 A1 * | 4/2005 | Bocko et al. | 341/143 |

FOREIGN PATENT DOCUMENTS

| EP | 0 835 556 A2 | 4/1998 |
|---|---|---|
| GB | 2 332 608 A | 6/1999 |

(Continued)

OTHER PUBLICATIONS

Extended European Search Report issued Jul. 30, 2014 for corresponding European Application No. 12 770 812.01.

(Continued)

*Primary Examiner* — Twyler Haskins
*Assistant Examiner* — Carramah J Quiett
(74) *Attorney, Agent, or Firm* — Michael Best & Friedrich LLP

(57) ABSTRACT

A pixel includes an embedded photo diode (PD), an amplification transistor forming a source follower circuit having a gate for input and a source for output, and a transfer transistor that transfers a charge to the gate of the amplification transistor, the charge being photoelectrically converted by the PD. The amplification transistor is formed in a semiconductor substrate electrically isolated from a substrate on which the embedded PD and the transfer transistor are formed and the substrate of the amplification transistor is in a floating state. The reading unit includes a ΔΣ modulator that inputs/outputs the image signal per pixel unit and the output of the ΔΣ modulator is given, as feedback, to a capacitative unit functioning as a capacity to integrate the pixel.

4 Claims, 15 Drawing Sheets

(51) Int. Cl.
  *H01L 27/00* (2006.01)
  *H01L 27/146* (2006.01)
  *H04N 5/378* (2011.01)
  *H04N 5/357* (2011.01)
  *H04N 5/365* (2011.01)

(56) References Cited

FOREIGN PATENT DOCUMENTS

| | | |
|---|---|---|
| JP | 2003-521608 A | 7/2003 |
| JP | 2005-323331 A | 11/2005 |
| JP | 2006-059857 A | 3/2006 |
| JP | 2006-339415 A | 12/2006 |
| JP | 2011-071958 A | 4/2011 |
| WO | WO-95/22180 A1 | 8/1995 |
| WO | WO-00/21280 A1 | 4/2000 |
| WO | WO-2005/008906 A2 | 1/2005 |
| WO | WO-2006/025232 A1 | 3/2006 |

OTHER PUBLICATIONS

Japanese Office Action issued Feb. 24, 2015 for corresponding Japanese Application No. 2011-087333.
International Search Report; Application No. PCT/2012/059069; Filed: Apr. 3, 2012. Completion of International Search Report: Apr. 20, 2012. (Form PCT/ISA/210).
Written Opinion of the International Searching Authority; Application No. PCT/2012/059069; Filed: Apr. 3, 2012. Report Dated: May 1, 2012. (Form PCT/ISA/237).
European Patent Office Communication Pursuant to Article 94(3) EPC issued Mar. 15, 2016 for corresponding European Application No. 12 770 812.1.
Kester, Walt "MT-022 Tutorial ADC Architectures III: Sigma-Delta ADC Basics", Oct. 30, 2008, XP055256686 Retrieved from the Internet: URL:http://www.analog.com/media/en/training-seminars/tutorials/MT-022.PDF, Retrieved on Mar. 9, 2016.

* cited by examiner

EXAMPLE OF 3-TRANSISTOR TYPE

SOLID-STATE IMAGE SENSOR AND CAMERA SYSTEM

TECHNICAL FIELD

The present disclosure relates to a solid-state image sensor including a CMOS image sensor and a camera system.

BACKGROUND ART

In recent years, the CMOS (Complimentary Metal Oxide Semiconductor) image sensor has attracted attention as an image sensor in place of CCD.

This is because the CMOS image sensor has overcome the following problems.

That is, a special process is needed for the production of CCD pixels, a plurality of power supply voltages is needed for the operation thereof, and further, a plurality of peripheral ICs needs to be combined for operation.

The CMOS sensor has overcome several problems such as a system being very complicated for CCD.

For the CMOS image sensor, a manufacturing process similar to that of a general CMOS-type integrated circuit can be used for the manufacture thereof, a single power supply is enough for driving, and further an analog circuit or logical circuit using a CMOS process can be mixed in the same chip.

Thus, the CMOS image sensor has a plurality of big advantages such as being able to reduce the number of peripheral ICs.

The above-described CMOS image sensor (hereinafter, the CMOS image sensor) is widely used in imaging devices such as digital cameras, camcorders, monitoring cameras, and on-vehicle cameras as an image sensor.

The mainstream output circuit of CCD is 1-channel (ch) output using an FD amplifier having a floating diffusion (FD) layer.

In contrast, the CMOS image sensor has an FD amplifier for each pixel and the mainstream output thereof is a column-parallel output type in which a row in an image array is selected and the row is read simultaneously in a column direction.

This is because it is difficult to obtain sufficient driving capabilities from an FD amplifier arranged in a pixel and the data rate needs to be lowered, which makes parallel processing advantageous.

A vast variety of signal output circuits of the column-parallel output type CMOS image sensor has been proposed. One such proposal is a type that includes an analog-digital conversion device (hereinafter, abbreviated as ADC (Analog digital converter)) for each column and captures a pixel signal as a digital signal.

A CMOS image sensor mounted with column-parallel type ADC is disclosed by Non-Patent Literature 1 and Patent Literature 1.

In addition, to realize high-precision AD conversion, a CMOS image sensor using a $\Delta\Sigma$ modulator is proposed (see, for example, Patent Literature 2 or Non-Patent Literature 2).

CITATION LIST

Patent Literature

Patent Literature 1:   JP 2005-323331 A
Patent Literature 2:   JP 2006-339415 A
Patent Literature 3:   JP (Japanese Patent Application) No. 2003-521608 A
Patent Literature 4:   JP 2006-59857 A

Non-Patent Literature

Non-Patent Literature 1: W. Yang et al. (W. Yang et. Al., "An Integrated 800×600 CMOS Image System," ISSCC Digest of Technical Papers, pp. 304-305, February, 1999)
Non-Patent Literature 2: Y. Chae (Y. Chea et. Al., "A 2.1 Mpixel 120 frame/s CMOS image Sensor wuth Column-Parallel $\Delta\Sigma$ ADC Architecture," ISSCC 2010/SESSION 22

SUMMARY OF INVENTION

Technical Problem

Incidentally, it is difficult for the conventionally used Nyquist ADC to be used in combination with high-speed imaging in multi-bit support of images, particularly when the number of bits is 14 or more.

According to the technology disclosed in Patent Literature 3, for example, doubling of speed of column-parallel ADC is realized.

However, this technology includes a sample/hold (S/H) circuit, which disadvantageously causes superimposition of so-called kTC noise.

Patent Literature 4 proposes sub-range/slope type AD conversion technology.

According to this technology, two ADCs are provided in a column to perform an AD conversion of sparse control and fine control. In this technology, a capacitor is charged by a current source in the column during sparse control and the AD conversion of the charge is performed during fine control.

However, two ADCs, sparse control ADC and fine control ADC, are used and thus, superimposition of noise is caused. Particularly in the case of the charging type to a capacitor shown in an embodiment thereof, switch noise is superimposed.

Patent Literature 2 discloses a technology to increase the speed by containing a $\Delta\Sigma$ modulator in a column.

More specifically, this is a method by which a column current source for reading a column from a pixel is caused to modulate a current for the feedback destination of an integrator or quantizer.

However, according to this technology, the layout area grows and it is difficult to design a fine pixel, for example, a pixel whose width is about 1 µm.

The present disclosure provides a solid-state image sensor capable of performing the AD conversion by multiple bits per pixel unit, compressing noise generated from pixels, and performing multi-bit high-speed imaging by fine pixels and a camera system.

Solution to Problem

According to a first aspect of the present disclosure, there is provided a solid-state image sensor including a pixel array unit in which a plurality of pixels including a photo diode that converts an optical signal into an electric signal is arranged, and a reading unit that reads an image signal from the pixel. The pixel includes an embedded photo diode, an amplification transistor forming a source follower circuit having a gate for input and a source for output, and a transfer transistor that transfers a charge to the gate of the amplification transistor, the charge being photoelectrically converted by the photo diode. The amplification transistor is formed in a semiconductor substrate electrically isolated from a substrate on which the embedded photo diode and the transfer transistor are formed and the substrate of the amplification transistor is in a floating state. The reading unit includes a ΔΣ modulator that inputs/outputs the image signal per pixel unit and the output of the ΔΣ modulator is given, as feedback, to a capacitative unit functioning as a capacity to integrate the pixel.

According to a second aspect of the present disclosure, there is provided a camera system including a solid-state image sensor, an optical system that forms a subject image on the image sensor, and a signal processing circuit that processes an output image signal of the image sensor. The solid-state image sensor includes a pixel array unit in which a plurality of pixels including a photo diode that converts an optical signal into an electric signal is arranged, and a reading unit that reads an image signal from the pixel. The pixel includes an embedded photo diode, an amplification transistor forming a source follower circuit having a gate for input and a source for output, and a transfer transistor that transfers a charge to the gate of the amplification transistor, the charge being photoelectrically converted by the photo diode. The amplification transistor is formed in a semiconductor substrate electrically isolated from a substrate on which the embedded photo diode and the transfer transistor are formed and the substrate of the amplification transistor is in a floating state. The reading unit includes a ΔΣ modulator that inputs/outputs the image signal per pixel unit, and the output of the ΔΣ modulator is given, as feedback, to a capacitative unit functioning as a capacity to integrate the pixel.

Advantageous Effects of Invention

According to the present disclosure, the AD conversion by multiple bits per pixel unit can be performed, noise generated from pixels can be compressed, and multi-bit high-speed imaging by fine pixels can be performed.

DESCRIPTION OF EMBODIMENT

Hereinafter, an embodiment of the present disclosure will be described by associating with the drawings.

The description will be provided in the following order:
1. Overview of the configuration of a solid-state image sensor
2. Basic operation of a pixel circuit
3. Concrete operation of the pixel circuit
4. Laminated structure example of the pixel circuit and a ΔΣ modulator (ΔΣ ADC)
5. Configuration example of a camera system <1. Overview of the Configuration of a Solid-State Image Sensor>

Figure 1:
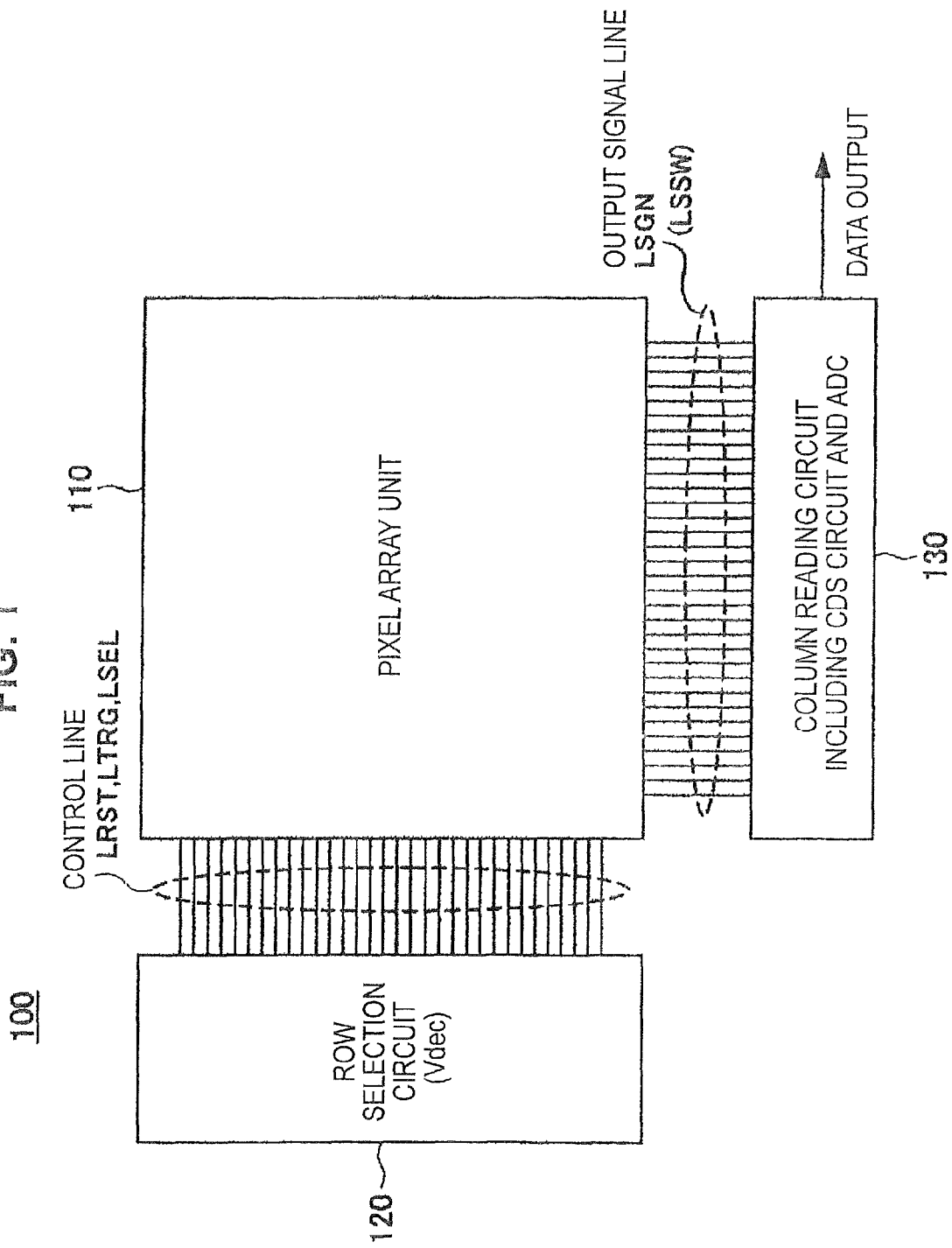
FIG. 1 is a diagram illustrating a configuration example of a CMOS image sensor (solid-state image sensor) according to the present embodiment.

FIG. 1 is a diagram illustrating a configuration example of a CMOS image sensor (solid-state image sensor) according to the present embodiment.

This CMOS image sensor 100 includes a pixel array unit 110, a row selection circuit (Vdec) 120 as a pixel drive unit, and a column reading circuit 130 having an AD conversion function by ΔΣ modulation for each column.

In the present embodiment, an AD converter is formed of a ΔΣ modulator having a ΔΣ modulation function and, for example, the AD converter formed of the ΔΣ modulator is configured to input/output a pixel signal per pixel unit.

In the present embodiment, the pixel array unit 110 and a portion or all of the column reading circuit 130 are formed by, for example, a laminated structure. Then, the pixel circuit and the AD converter formed of the ΔΣ modulator are electrically connected to a switching transistor through a metal junction as TSV (through SiVia).

The pixel array unit 110 has a plurality of pixel circuits 110A arranged in a two-dimensional shape (matrix shape) of M rows×N columns.

Figure 2:
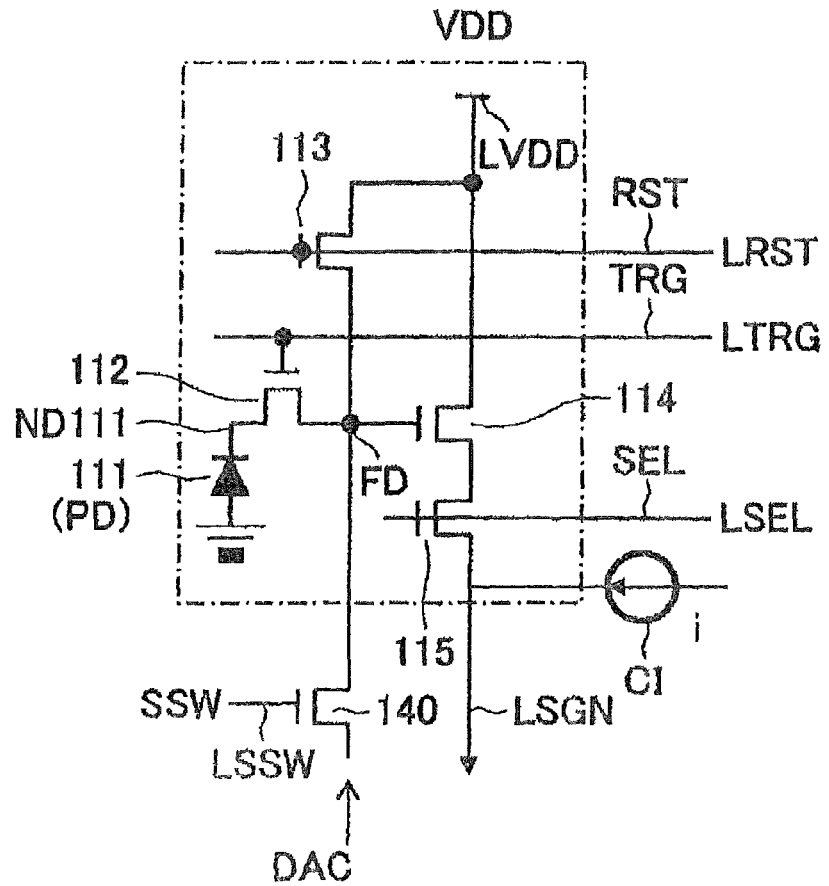
FIG. 2 is a diagram illustrating an example of a pixel of the CMOS image sensor according to the present embodiment.

FIG. 2 is a diagram illustrating an example of a pixel of the CMOS image sensor according to the present embodiment.

The pixel circuit 110A includes a photo diode (PD, may simply be called PD below) 111 as a photoelectric conversion element.

Then, the pixel circuit 110A includes four transistors of a transfer transistor 112, a reset transistor 113, an amplification transistor 114, and a select transistor 115 for the one photo diode 111.

The transfer transistor 112, the reset transistor 113, the amplification transistor 114, and the select transistor 115 are formed from an insulated gate field effect transistor (FET). A FET of an n channel is applied in the example of FIG. 2, but a FET of a p channel can also be applied.

An example of a 4-transistor type pixel circuit is illustrated here, but a 3-transistor type including a select transistor or the like can also be applied.

The photo diode 111 performs a photoelectric conversion of incident light into charges (here, electrons) of the amount corresponding to the quantity of light.

The transfer transistor 112 is connected between the photo diode 111 and floating diffusion FD (may simply be called FD below) as an output node. The transfer transistor 112 has a transfer signal TRG as a control signal provided to the gate (transfer gate) thereof through a transfer control line LTRG.

Accordingly, the transfer transistor 112 transfers charges (electrons) photoelectrically converted by the photo diode 111 to the floating diffusion FD.

The reset transistor 113 is connected between a power supply line LVDD and the floating diffusion FD and has a reset signal RST as a control signal provided to the gate (transfer gate) thereof through a reset control line LRST.

Accordingly, the reset transistor 113 resets the potential of the floating diffusion FD to the potential of the power supply line LVDD.

The gate of the amplification transistor 114 is connected to the floating diffusion FD. The amplification transistor 114 is connected to a signal line LSGN via the select transistor 115 to constitute a source follower together with a constant current source CI outside a pixel portion.

Then, a select signal SEL as a control signal corresponding to an address signal is provided to the gate of the select transistor 115 through a select control line LSEL to turn on the select transistor 115.

When the select transistor 115 is turned on, the amplification transistor 114 amplifies the potential of the floating diffusion FD to output a voltage corresponding to the potential to the signal line LSGN. The voltage output from each pixel through the signal line LSGN is output to the column reading circuit 130.

These operations are performed for each pixel in a row simultaneously because, for example, each gate of the transfer transistor 112, the reset transistor 113, and the select transistor 115 is connected in rows.

The pixel circuit 110A, for example, the floating diffusion FD is connected to the DAC output side of a feedback system of the ΔΣ modulator (ΔΣ ADC) via a switching transistor 140.

The switching transistor 140 is formed on a substrate separate from the substrate on which the pixel circuit 110A is formed and drive control of ON/OFF thereof is exercised by a switching signal SSW supplied through a switching line LSSW.

The reset control line LRST, the transfer control line LTRG, and the select control line LSEL wired in the pixel array unit 110 are wired as a set in rows of a pixel array.

M control lines are provided for each of LRST, LTRG, and LSEL.

These reset control line LRST, the transfer control line LTRG, and the select control line LSEL are driven by the row selection circuit 120.

The switching line LSSW is driven by, for example, the column reading circuit 130.

The row selection circuit 120 controls the operation of pixels in any row in the pixel array unit 110. The row selection circuit 120 controls pixels through control lines LSEL, LRST, LTRG.

The column reading circuit 130 receives pixel row data controlled to be read by the row selection circuit 120 via the signal output line LSGN and transfers the data to a subsequent signal processing circuit.

The reading circuit 130 contains a CDS circuit or ADC (analog digital converter).

ADC is formed of a ΔΣ modulator having a ΔΣ modulation function and, for example, ADC formed of the ΔΣ modulator is configured to input/output a pixel signal per pixel unit.

Figure 3:
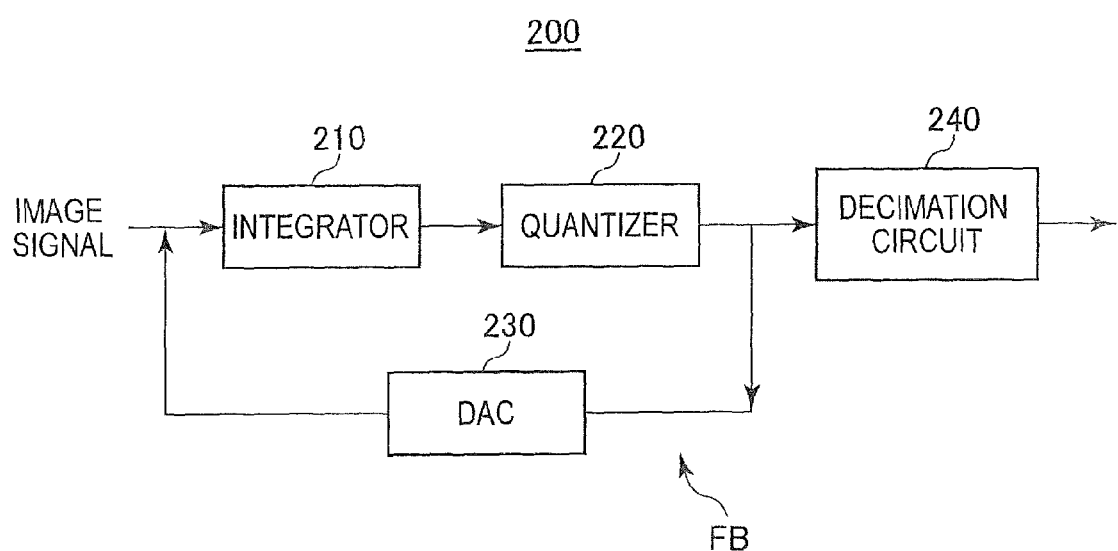
FIG. 3 is a diagram illustrating a basic configuration of a ΔΣ modulator (ΔΣ ADC) according to the present embodiment.

FIG. 3 is a diagram illustrating a basic configuration of a ΔΣ modulator (ΔΣ ADC) according to the present embodiment.

A ΔΣ modulator (ΔΣ ADC) 200 includes at least an integrator 210, a quantizer 220, and a DAC 230 forming a portion of a feedback system to the pixel circuit 110A. Output of the DAC 230 is connected to the floating diffusion FD of the pixel circuit 110A through the switching transistor 140.

The ΔΣ modulator outputs a signal obtained from the pixel circuit 110A as 1-bit data through the integrator 210 and the quantizer 220.

The ΔΣ modulator has a decimation circuit (decimation filter) 240 that converts 1-bit data into multi-bit data arranged on the output side of the quantizer.

The description below focuses on a concrete configuration, laminated structure, and connected state of the pixel circuit of the pixel array unit 110 and the ΔΣ AD converter connected to the pixel circuit.

In the CMOS image sensor 100 according to the present embodiment, the floating diffusion FD (or the PD 111) performs E modulation of the ΔΣ scheme.

When ΔΣ modulation is performed by the floating diffusion FD or the PD 111, a switch (the switching transistor 140 in FIG. 2) to perform feedback access to FD or PD is formed.

The ΔΣ modulator (ΔΣ ADC) 200 is formed on a substrate separate from the substrate of the PD 11 of a pixel and the pixel circuit 110A.

The pixel circuit 110A and the ΔΣ modulator (ΔΣ ADC) 200 have, as described above, a structure that establishes electric connection to the switching transistor 140 through a metal connection as TSV.

The feedback (FB) system allows electric connection to a capacity of FD or PD that performs integration. In other words, FD or PD can be used as a capacitative unit functioning as a capacity to be integrated. Feedback can also be performed by using TSV.

Further, the decimation circuit that converts 1-bit data into multi-bit data has a structure formed on a substrate separate from the substrate of, for example, the pixel circuit 110A.

Figure 4:
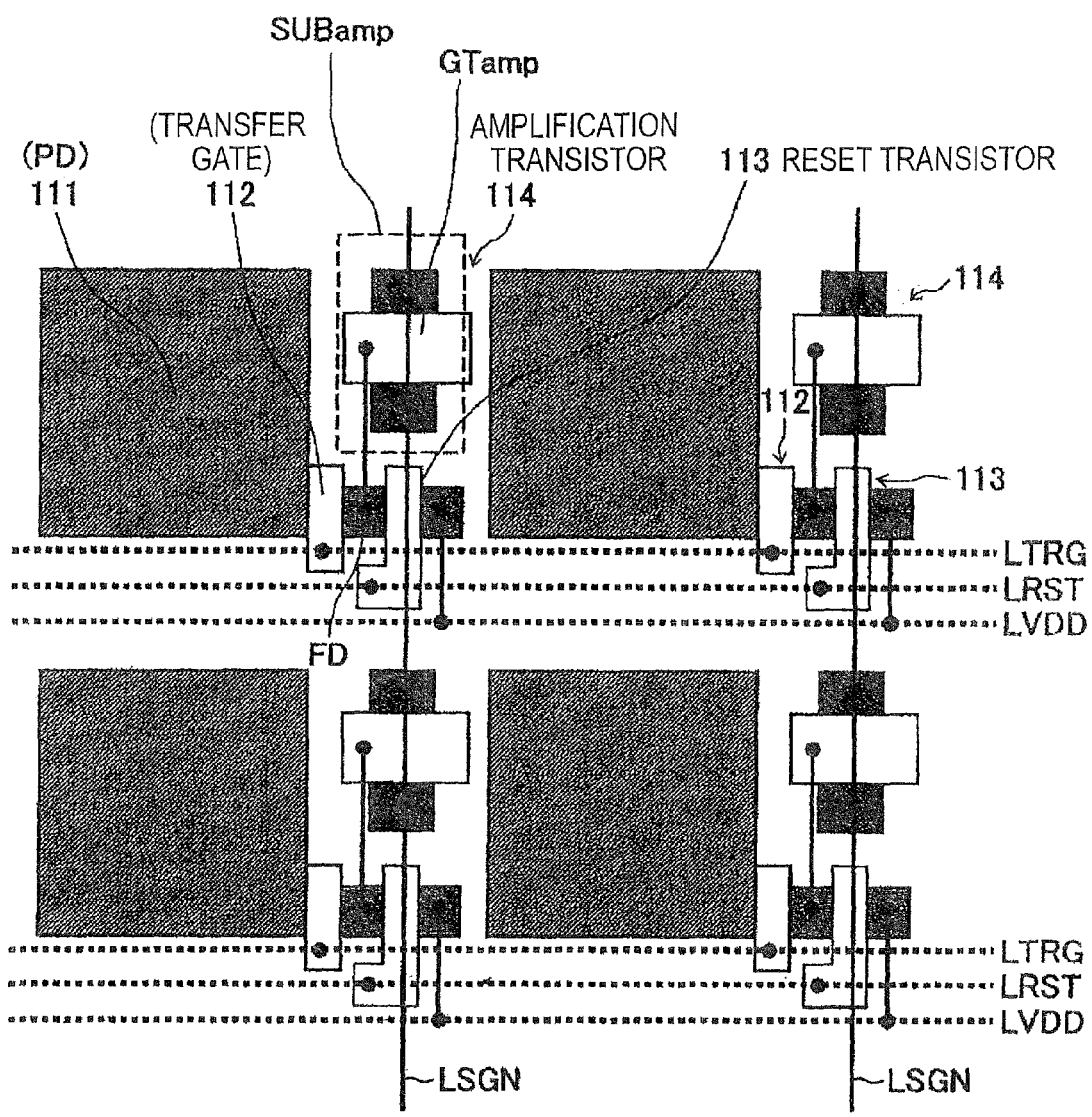
FIG. 4 is a diagram illustrating a layout example of a pixel array unit according to the present embodiment.

FIG. 4 is a diagram illustrating a layout example of a pixel array unit according to the present embodiment.

To make an understanding easier, the example of FIG. 4 illustrates a 3-transistor type that does not contain the select transistor in FIG. 2.

In the present embodiment, the amplification transistor 114 is formed on a semiconductor substrate (or a well) SUBamp electrically separated from the substrate on which the embedded PD 111 and the transfer transistor 112 are formed. The substrate SUBamp on which the amplification transistor 114 is connected to a source of the amplification transistor 114 or held in a floating state by an SOI structure.

Figure 5:
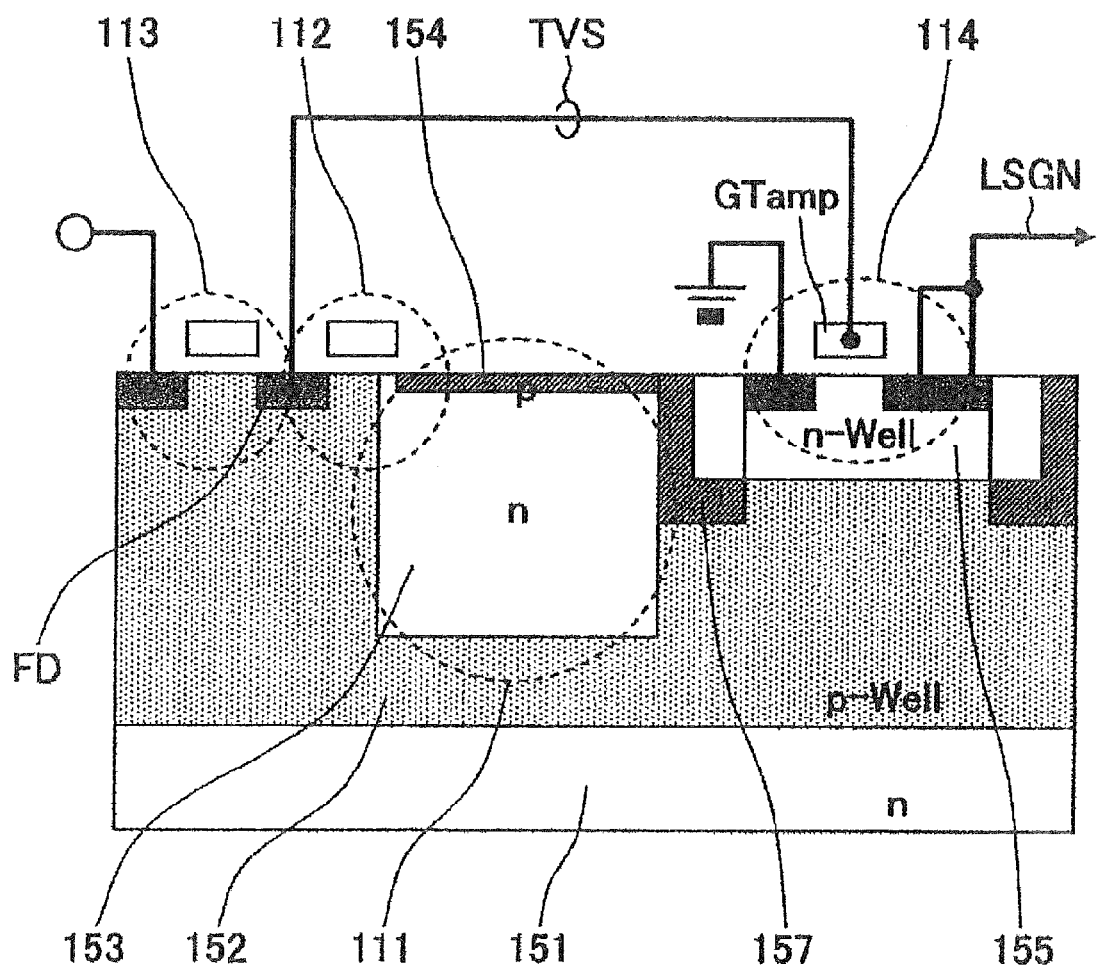
FIG. 5 is a diagram illustrating a simplified section of a pixel circuit according to the present embodiment.

FIG. 5 is a diagram illustrating a simplified section of a pixel circuit according to the present embodiment.

FIG. 5 illustrates a simplified section corresponding to the 3-transistor pixel circuit in FIG. 4.

A pixel circuit 110B has a p-well region 152 for pixels formed in a thin n-type layer 151 epitaxially formed on a wafer. The photo diode (the PD 111), the transfer transistor 112, the reset transistor 113, and the amplification transistor 114 constituting a pixel are formed on the p-well region 152.

The photo diode (PD) 111 has a p-type layer 154 formed on the substrate surface side of an n-type accumulation layer 153 and is formed as a so-called "embedded photo diode" in which the signal charge accumulation layer is sandwiched between the p-type layer 154 and the opposite conductive layer 152.

In the present example, an HAD (Hole Accumulation Diode) type in which the n-type accumulation layer 153 is sandwiched between the p-type layer 154 on the surface side and the p-well region 152 of the substrate is adopted.

Then, the amplification transistor 114 is formed in an n-well region 155 formed in parallel with the photo diode 111 in the p-well region 152. The n-well region 155 is separated from the n-type accumulation layer 153 of the photo diode 111 by a p-type layer 157.

The floating diffusion FD is formed by a diffusion layer being shared by the drain of the transfer transistor 112 and the source of the reset transistor 113.

Then, the floating diffusion FD and an input unit of a gate GTamp of the amplification transistor 114 are connected by TVS. The source of the amplification transistor 114 is connected to a signal line LSG and the drain thereof is grounded.

<2. Basic Operation of a Pixel Circuit>

Next, the basic operation of the pixel circuits 110A, 110B according to the present invention will be described.

In the pixel circuit 110A, photons incident on a silicon substrate generate pairs of electrons and holes and electrons of these electrons and holes are accumulated in an accumulation node ND111 by the embedded photo diode 111.

Electrons accumulated in the accumulation node ND111 are transferred to the floating diffusion FD by the transfer transistor 112 being turned on, thereby driving the gate of the amplification transistor 114.

On the other hand, the reset transistor 113 whose source is connected to the floating diffusion FD and whose drain is connected to a power supply is used to reset pixels.

The drain of the amplification transistor 114 is connected to the power supply and the source thereof is connected to a vertical signal line LSGN via the select transistor 115 or directly. The vertical signal line LSGN is shared among a plurality of pixels arranged in the column direction.

A signal charge transferred to the floating diffusion FD is output as a signal to the vertical signal line LSGN.

An analog signal VSL that is output is $\Delta\Sigma$-modulated by the $\Delta\Sigma$ modulator 200 before being output as 1-bit digital data. At this point, a remaining signal is given to the DAC 230 as feedback and captured by the floating diffusion FD through the switching transistor 140.

<3. Concrete Operation of the Pixel Circuit>

Figure 6:
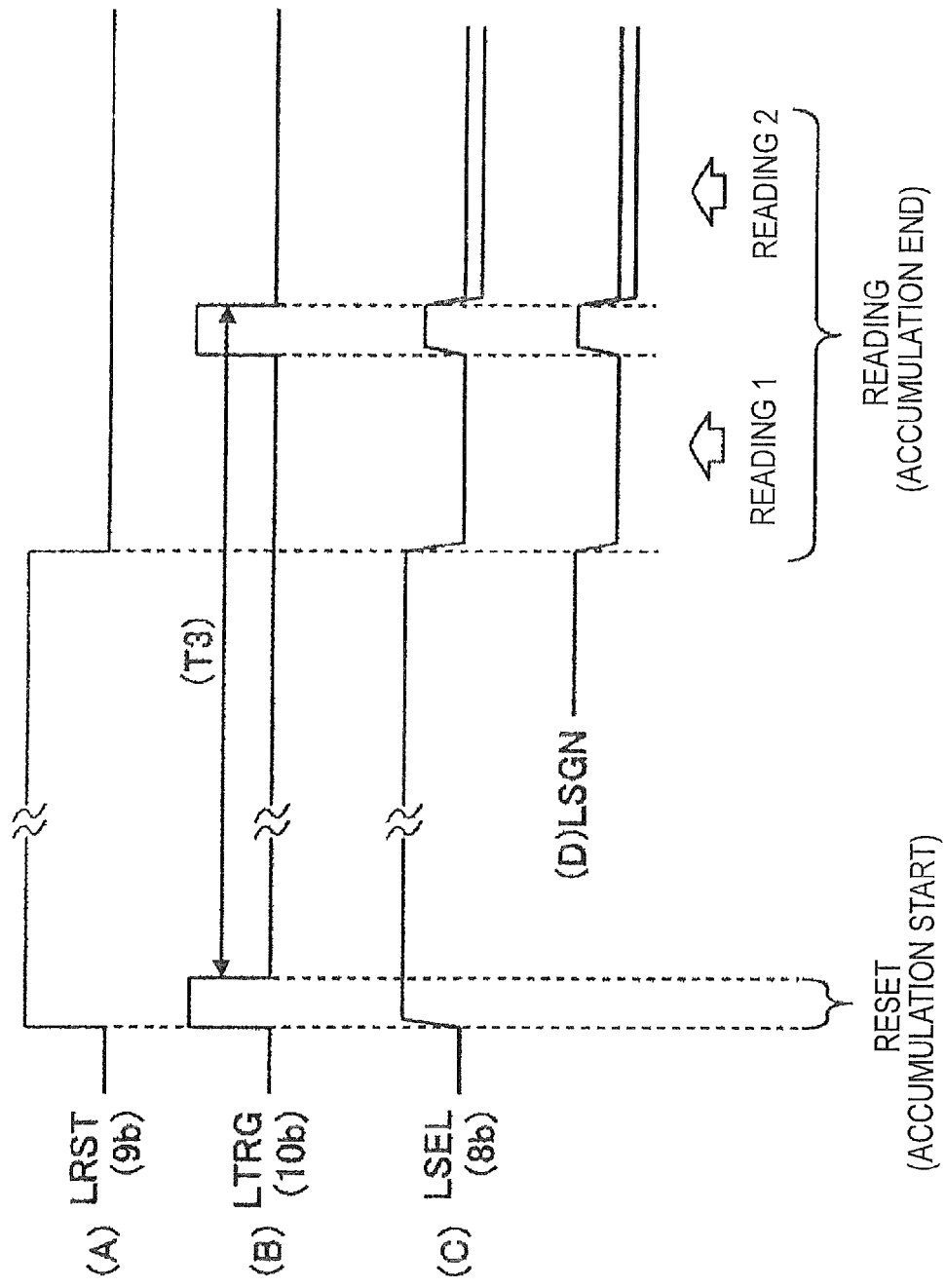
FIG. 6 is a timing chart illustrating a concrete operation of charge accumulation and reading of the pixel circuit according to the present embodiment.

FIG. 6 is a timing chart illustrating a concrete operation of charge accumulation and reading of the pixel circuit according to the present embodiment.

First, pixels are reset. The reset signal RST to the reset control line LRST and the transfer signal TRG to the transfer control line LTRG are set to a high level during reset, thereby turning on the reset transistor 113 and the transfer transistor 112.

This is, for example, an operation to transfer the power supply voltage of 1.8 V to an accumulation node of the photo diode 111. Accordingly, the potential of the accumulation node ND111 rises and electrons accumulated there are extracted.

Particularly in the HAD structure, the accumulation node is formed of a thin n-type layer sandwiched between p-type layers and electrons thereof are all discharged, creating a complete depletion state.

Thereafter, the transfer signal TRG to the transfer control line LTRG is switched to a low level to turn off the transfer transistor 112. Accordingly, the accumulation node ND111 is changed to a floating state to newly start charge accumulation.

On the other hand, the reset signal RST to the reset control line LRST is maintained at the high level during electric field accumulation and the reset transistor 113 of non-selected pixels is set to the ON state.

Accordingly, the floating diffusion FD to which the gate of the amplification transistor 114 is connected is maintained at the power supply voltage level. The amplification transistor 114 of non-selected pixels is in the OFF state.

Next, a reading operation of accumulated charges will be described.

First, the reset signal RST to the reset control line LRST of the selected row is switched to the low level to turn off the reset transistor 113. At this point, the potential of the floating diffusion FD changes, for example, from 1.8 V to 0.8 V to be in a floating state under the action of coupling with the reset transistor 113. Accordingly, the amplification transistor 114 is changed to the ON state.

Here, the amplification transistor 114 and the vertical signal line LSGN connected to the constant current source CI form a source follower circuit. A potential Vfd of the floating diffusion FD as the input of the source follower circuit and a potential VSL of the vertical signal line LSGN as the output have a linear relationship whose fluctuation ratio is close to 1.

That is, if the current value of the constant current source CI is i, the following relation ideally holds:

$$i=(1/2)*\beta*(Vfd-Vth-VSL)^2 \qquad \text{[Math 1]}$$

where $\beta$ is a constant.

In the above formula, (Vfd−Vth−VSL) becomes constant and fluctuations of Vfd are reflected in VSL with a gain close to 1. That is, when the amplification transistor 114 changes to the ON state, potential fluctuations of the floating diffusion FD are reflected in potential fluctuations of the vertical signal line LSGN.

A first read is performed here and the potential appearing in the vertical signal line LSGN is temporarily held by a sense circuit (not illustrated).

Next, the transfer signal TRG to the transfer control line LTRG is set to the high level to turn on the transfer transistor 112. Accordingly, the potential of the floating diffusion FD rises under the action of coupling with the gate of the transfer transistor 112 and also electrons flow into the floating diffusion FD.

If the potential of the floating diffusion FD is sufficiently high, all accumulated electrons flow out into the floating diffusion FD and FD is in a complete depletion state.

Thereafter, the transfer signal TRG to the transfer control line LTRG is switched to a low level to turn off the transfer transistor 112. Accordingly, the potential of the floating diffusion FD falls by an amount corresponding to a signal charge when compared with the potential before the transfer control line LTRG is driven.

That is, if the incidence of photons disappears altogether, the potential returns to the original potential of about 0.8 V, but if photons are incident and photoelectrons are generated, the potential falls in accordance with the number of photoelectrons and becomes equal to, for example, 0.7 V. This is reflected in the vertical signal line LSGN as output of the source follower.

In the above example, ON/OFF of the amplification transistor 114 is controlled exclusively by coupling with the gate of the reset transistor 113.

Figure 7:
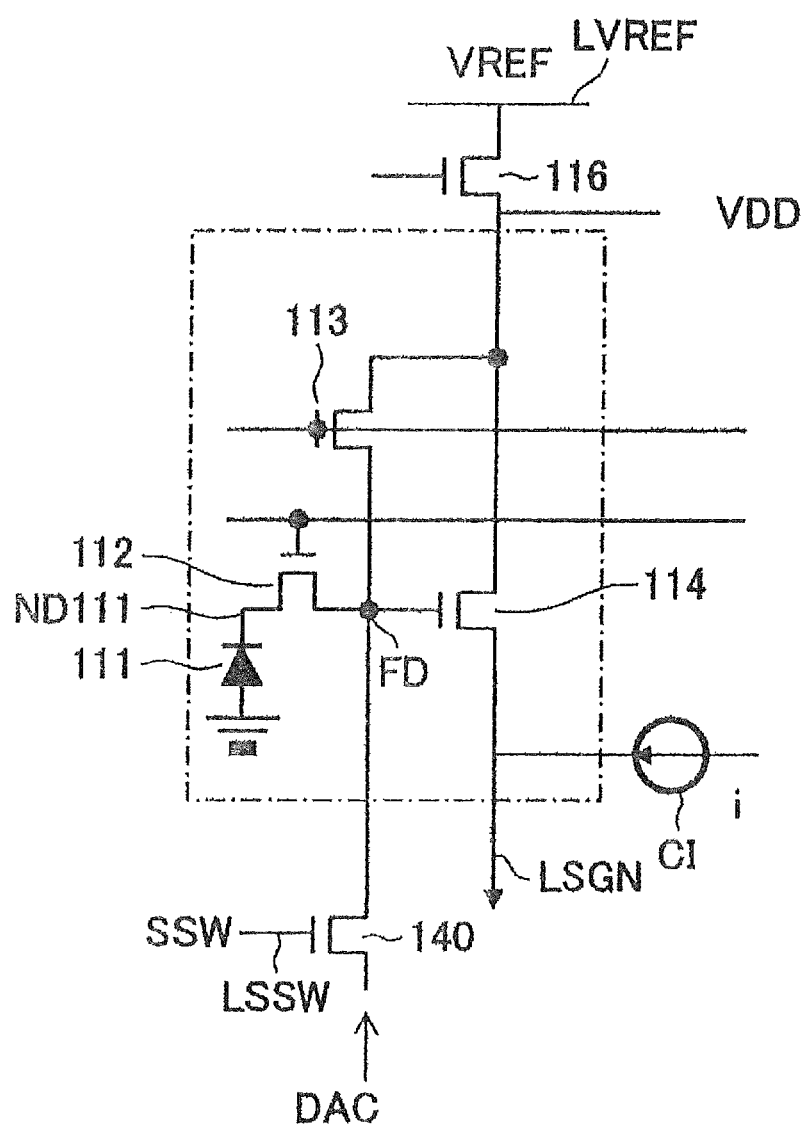
FIG. 7 is a diagram illustrating another example of the pixel of the CMOS image sensor according to the present embodiment.

This is an effective means for simplifying wiring, but if necessary, as shown in FIG. 7, the drain of the reset transistor 113 can also be connected to a power supply line LVREF via the switching transistor 116.

For example, the voltage VREF of the power supply line LVREF may be raised while a pixel is not selected to raise the potential of the floating diffusion FD still further.

The current can thereby be entirely prevented from leaking from the amplification transistor 114 while a pixel is not selected and the non-selected pixel can be inhibited from generating unnecessary noise in the vertical signal line LSGN.

A signal obtained from the pixel circuit 110A (110B) is output as 1-bit data through the integrator 210 and the quantizer 220 of the ΔΣ modulator 200.

In addition, a portion of data is given to the floating diffusion FD of the pixel circuit 110A (110B) as feedback through the DAC 230 of the feedback system and the switching transistor 140. The feedback signal is output to the integrator 210 together with accumulated image signals.

A concrete configuration example of the ΔΣ modulator (ΔΣ ADC) 200 will be described here.

Figure 8:
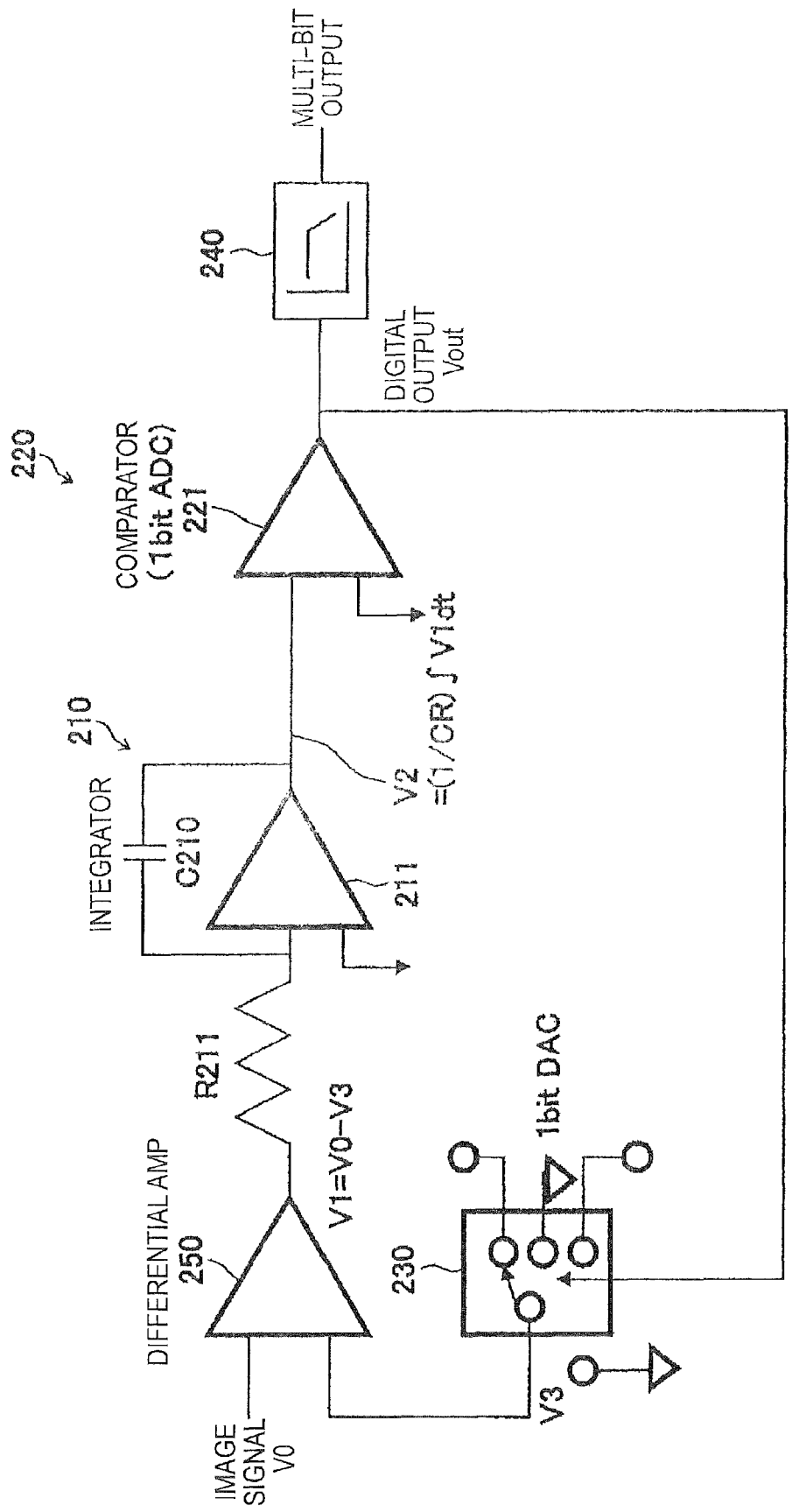
FIG. 8 is a diagram illustrating a concrete configuration example of the ΔΣ modulator ΔΣ ADC).

FIG. 8 is a diagram illustrating a concrete configuration example of the ΔΣ modulator (ΔΣ ADC) 200.

The ΔΣ modulator 200 in FIG. 8 includes a differential amplifier (a differential amp) 250 that puts together an image signal (V0) and feedback data (V3) of the DAC 230 on the input side of the integrator 210 and amplifies and outputs a difference V1 (V0−V3) thereof to the integrator 210.

The integrator 210 includes a resistance element R210 connected to an input stage, an operational amplifier 211 having output of the differential amplifier 250 input into one input, and a capacity C210 connected between input and output of the operational amplifier 211. An output signal V2 of the integrator 210 is given by $[(1/CR)\int V1 dt]$.

The quantizer 220 a comparator 221 that compares output of the integrator 210 and a reference voltage and outputs 1-bit digital data to the DAC 230 and the decimation circuit 240.

<4. Laminated Structure Example of the Pixel Circuit and a ΔΣ Modulator (ΔΣ ADC)>

The ΔΣ modulator (ΔΣ ADC) 200 and the pixel circuit 110A (110B) having the above configuration are formed by including, for example, a laminated structure illustrated below.

Hereinafter, laminated structure examples of the pixel circuit 110A (110B) and the ΔΣ modulator (ΔΣ ADC) 200 will be described by associating with FIGS. 9 to 15.

FIGS. 9 to 15 illustrate the pixel circuit and ΔΣ modulator and also the layout and sectional view of a transistor for the operation thereof.

These laminated structure examples have a three-dimensional space structure 300 and are produced by overlaying two structures (semiconductor substrates) 310, 320.

<4.1 First Laminated Structure Example of the Pixel Circuit and the ΔΣ Modulator (ΔΣ ADC)>

Figure 9:
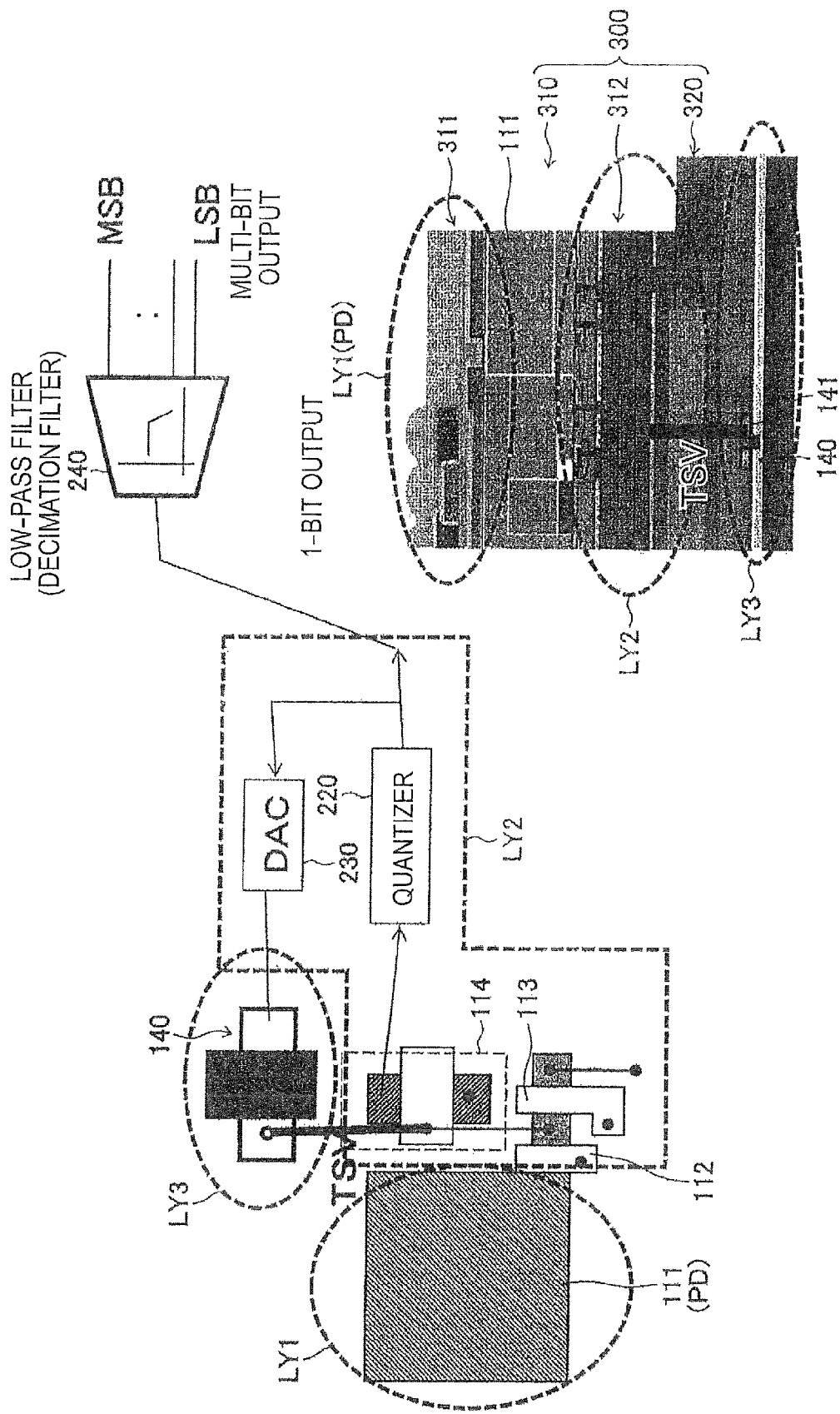
FIG. 9 is a diagram illustrating a first laminated structure example of the pixel circuit and the ΔΣ modulator ΔΣ ADC).

FIG. 9 is a diagram illustrating a first laminated structure example of the pixel circuit and the ΔΣ modulator (ΔΣ ADC).

In the example of FIG. 9, the photo diode 111 is formed on a back side 311 of a first substrate 310 and each transistor of the quantizer 220, the DAC 230, and the pixel circuit 110A (110B) is formed on the front side.

A circuit necessary for ΔΣ operation is formed on a second substrate 320 and the switching transistor 140 for feedback from the DAC 230 is formed on the lowest layer side of the second substrate.

Then, an output unit of the DAC 230 formed on a front side 312 of the first substrate 310 and a diffusion layer 141 of one of the source/drain formed on the lowest layer side of the second substrate 320 are electrically connected through the metal junction of TSV (through via) formed in the second substrate 320.

<4.2 Second Laminated Structure Example of the Pixel Circuit and the ΔΣ Modulator (ΔΣ ADC)>

Figure 10:
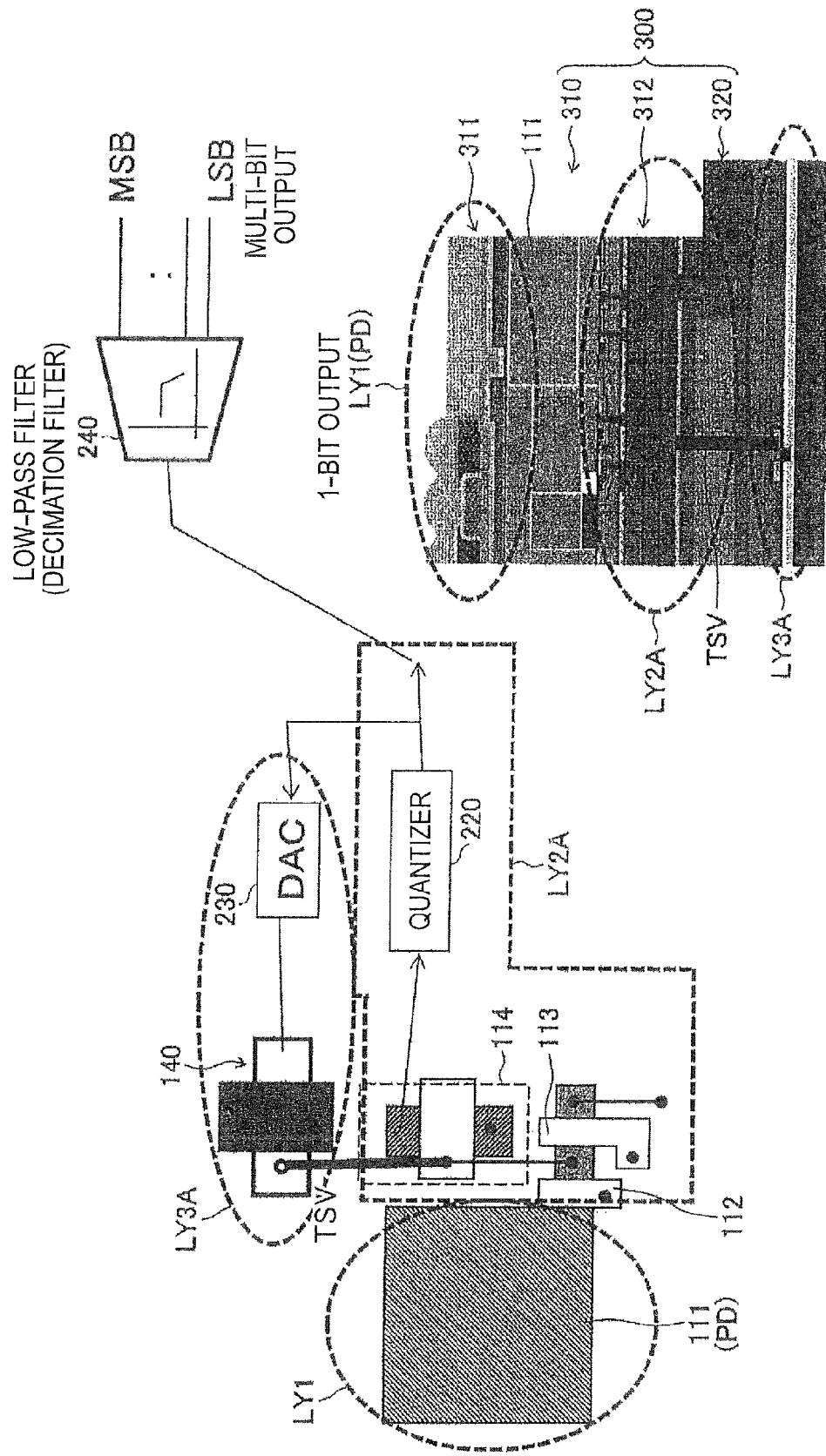
FIG. 10 is a diagram illustrating a second laminated structure example of the pixel circuit and the ΔΣ modulator (ΔΣ ADC).

FIG. 10 is a diagram illustrating a second laminated structure example of the pixel circuit and the ΔΣ modulator (ΔΣ ADC).

The example of FIG. 10 is different from the example of FIG. 9 in that the DAC 230 is formed in the lowest layer of the second substrate 320.

In this case, the output unit of the quantizer 220 on the front side 312 of the first substrate 310 and the diffusion layer of one of the source/drain of the transistor forming an input unit of the DAC 230 are connected.

To simplify the drawing, only one transistor is illustrated in the lowest layer of the second substrate 320 in FIG. 10.

<4.3 Third Laminated Structure Example of the Pixel Circuit and the ΔΣ Modulator (ΔΣ ADC)>

Figure 11:
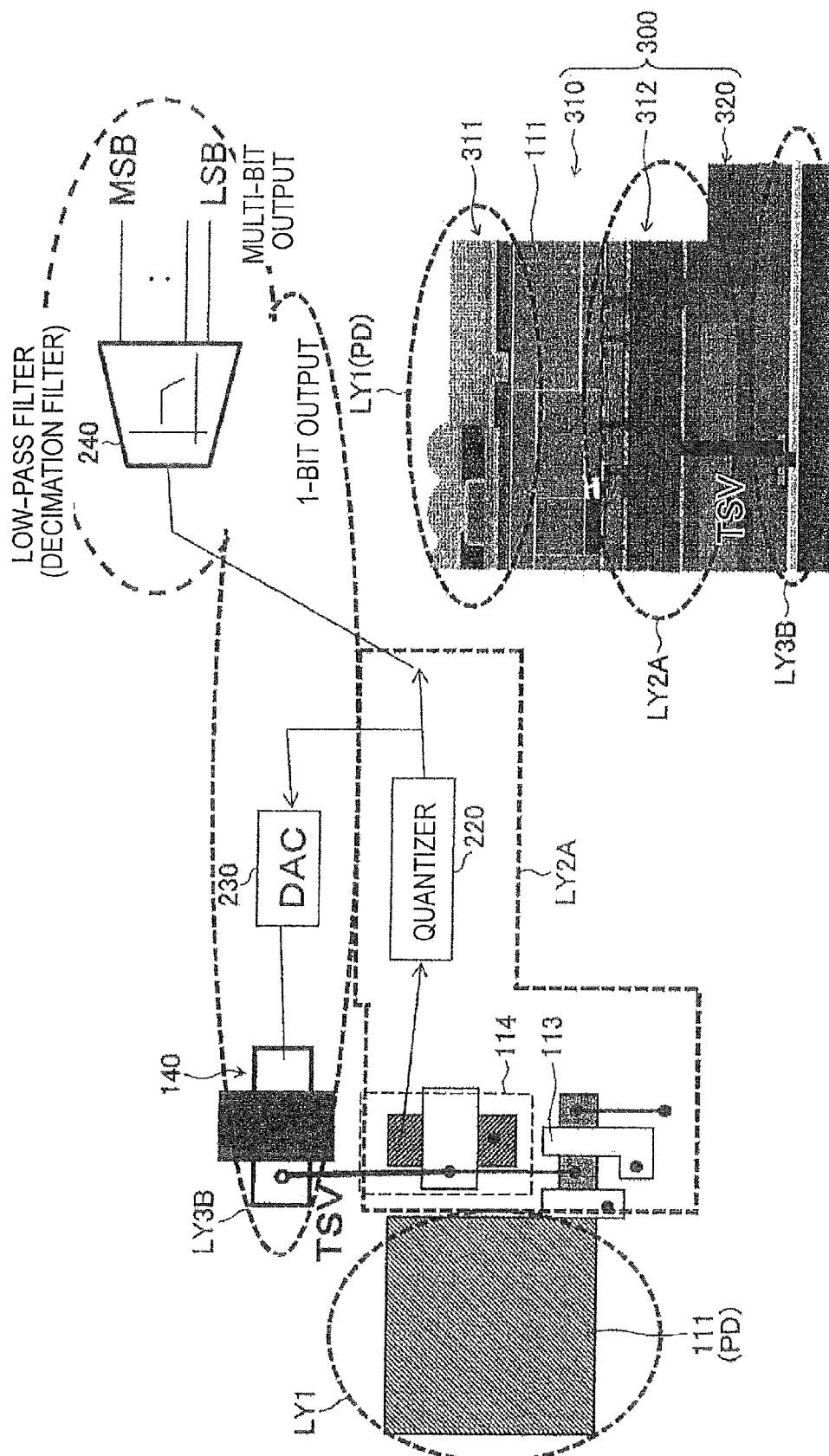
FIG. 11 is a diagram illustrating a third laminated structure example of the pixel circuit and the ΔΣ modulator (ΔΣ ADC).

FIG. 11 is a diagram illustrating a third laminated structure example of the pixel circuit and the ΔΣ modulator (ΔΣ ADC).

The example of FIG. 11 is different from the example of FIG. 10 in that, in addition to the DAC 230, the decimation circuit 240 is formed in the lowest layer of the second substrate 320.

In this case, the output unit of the quantizer 220 on the front side 312 of the first substrate 310 and the diffusion layer of one of the source/drain of the transistor forming the input unit of the DAC 230 and the decimation circuit 240 are connected.

To simplify the drawing, only one transistor is illustrated in the lowest layer of the second substrate 320 in FIG. 11.

<4.4 Fourth Laminated Structure Example of the Pixel Circuit and the ΔΣ Modulator (ΔΣ ADC)>

Figure 12:
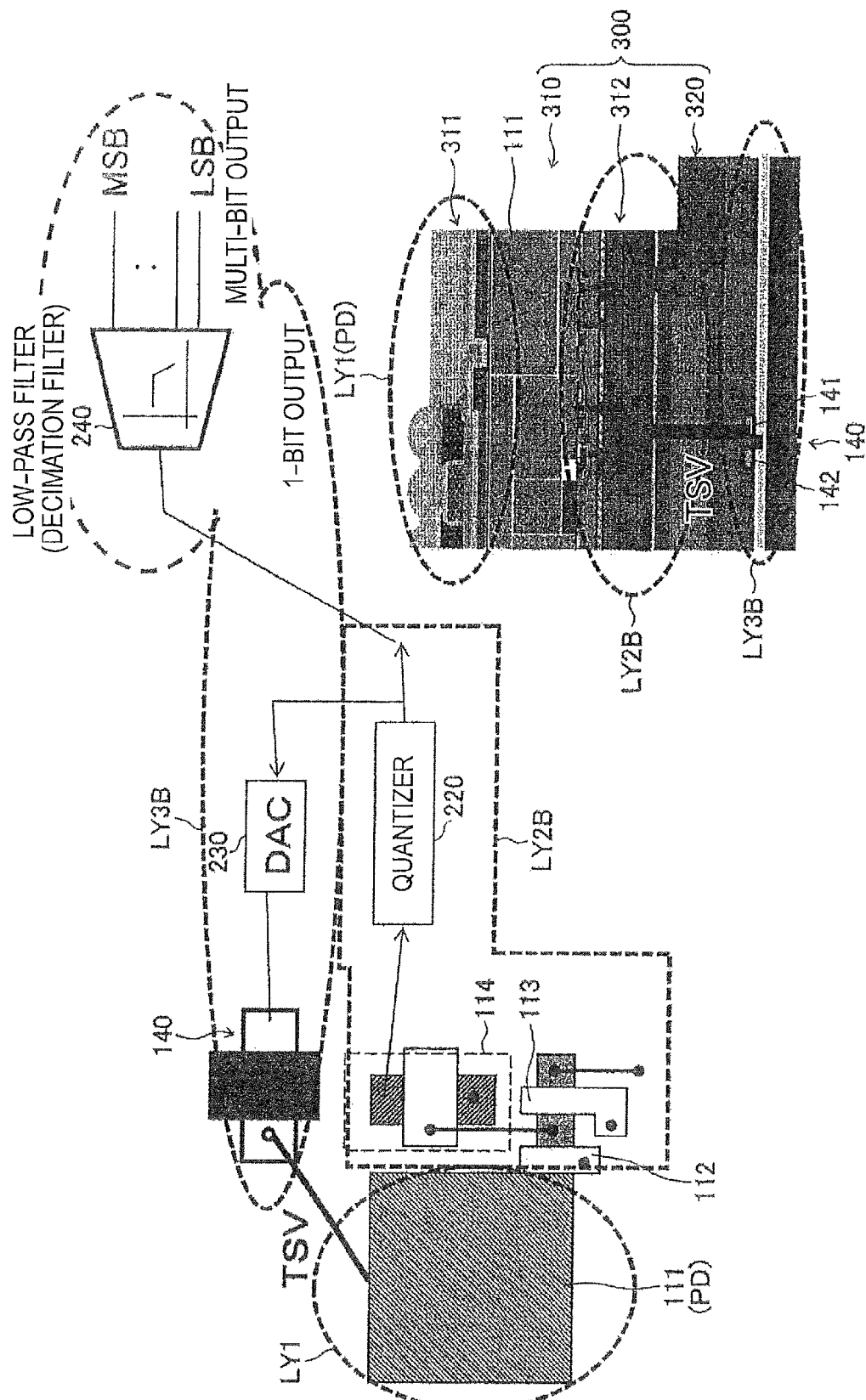
FIG. 12 is a diagram illustrating a fourth laminated structure example of the pixel circuit and the ΔΣ modulator (ΔΣ ADC).

FIG. 12 is a diagram illustrating a fourth laminated structure example of the pixel circuit and the ΔΣ modulator (ΔΣ ADC).

The example of FIG. 12 has a structure similar to that of the example of FIG. 11, but in terms of layout, is an example in which feedback from the DAC 230 is connected to the photo diode 111 via the switching transistor 140.

<4.5 Fifth Laminated Structure Example of the Pixel Circuit and the ΔΣ modulator (ΔΣ ADC)>

Figure 13:
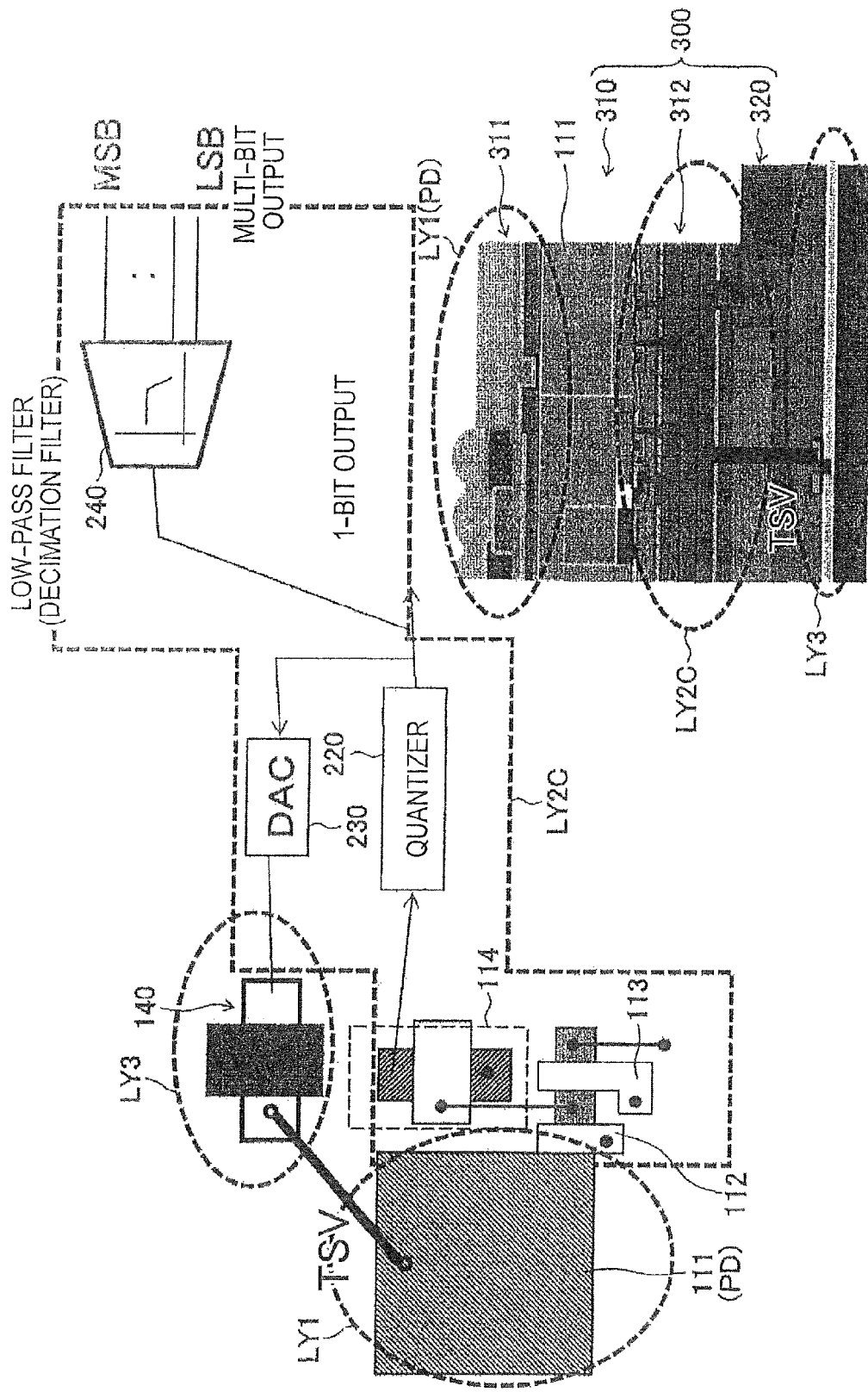
FIG. 13 is a diagram illustrating a fifth laminated structure example of the pixel circuit and the ΔΣ modulator (ΔΣ ADC).

FIG. 13 is a diagram illustrating a fifth laminated structure example of the pixel circuit and the ΔΣ modulator (ΔΣ ADC).

The example of FIG. 13 has a structure similar to that of the example of FIG. 12, but is an example in which the DAC 230 is formed on the front side 312 of the first substrate 310 on which the pixel circuit is formed, instead of the lowest layer of the second substrate.

<4.6 Sixth Laminated Structure Example of the Pixel Circuit and the ΔΣ Modulator (ΔΣ ADC)>

Figure 14:
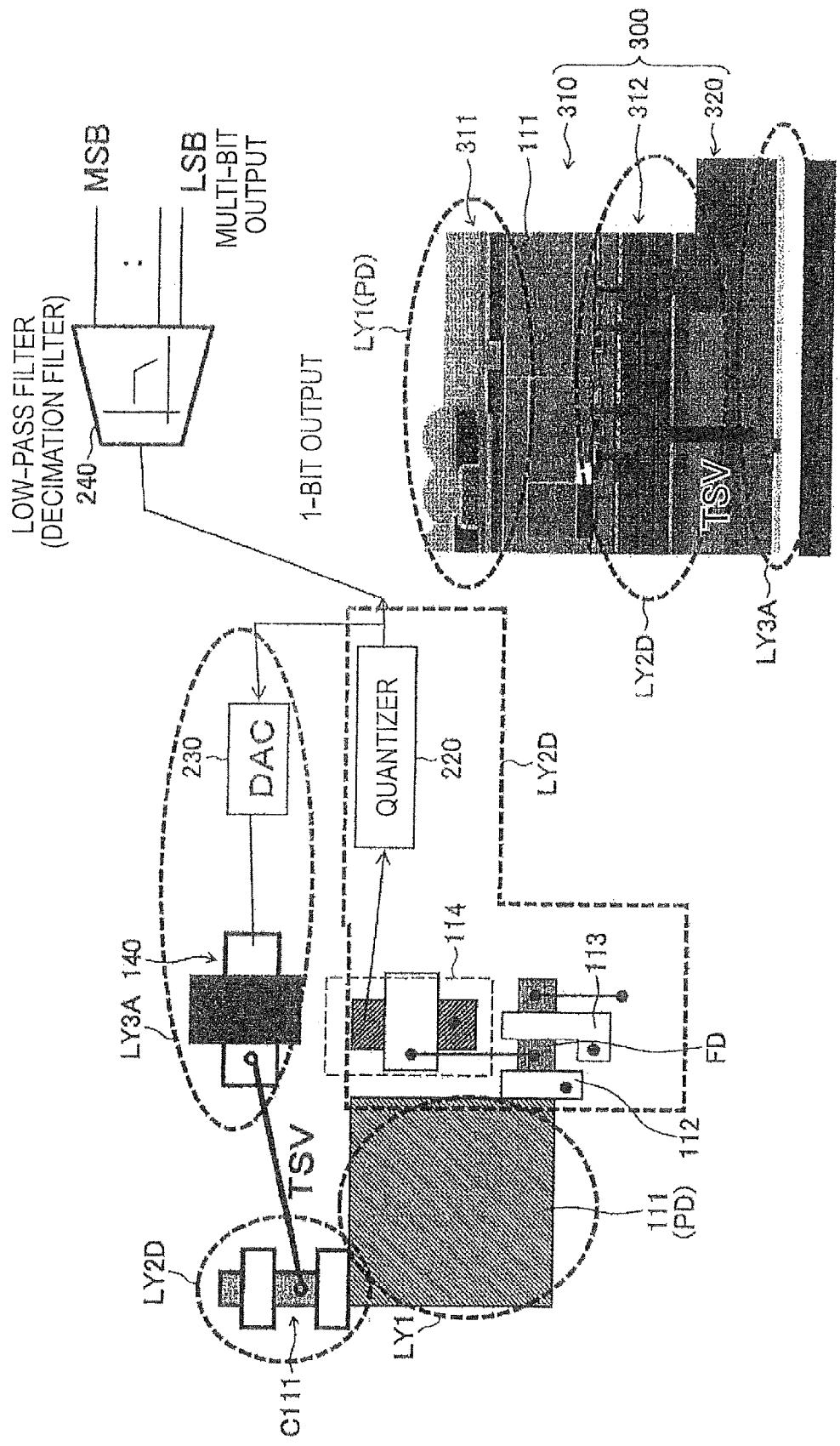
FIG. 14 is a diagram illustrating a sixth laminated structure example of the pixel circuit and the ΔΣ modulator (ΔΣ ADC).

FIG. 14 is a diagram illustrating a sixth laminated structure example of the pixel circuit and the ΔΣ modulator (ΔΣ ADC).

The example of FIG. 14 has a structure similar to that of the example of FIG. 9, but in terms of layout, is an example in which feedback from the DAC 230 is connected to the capacity C111 connected to the photo diode 111 via the switching transistor 140.

The capacity C111 is a different capacitative element from the floating diffusion FD.

<4.7 Seventh Laminated Structure Example of the Pixel Circuit and the ΔΣ modulator (ΔΣ ADC)>

Figure 15:
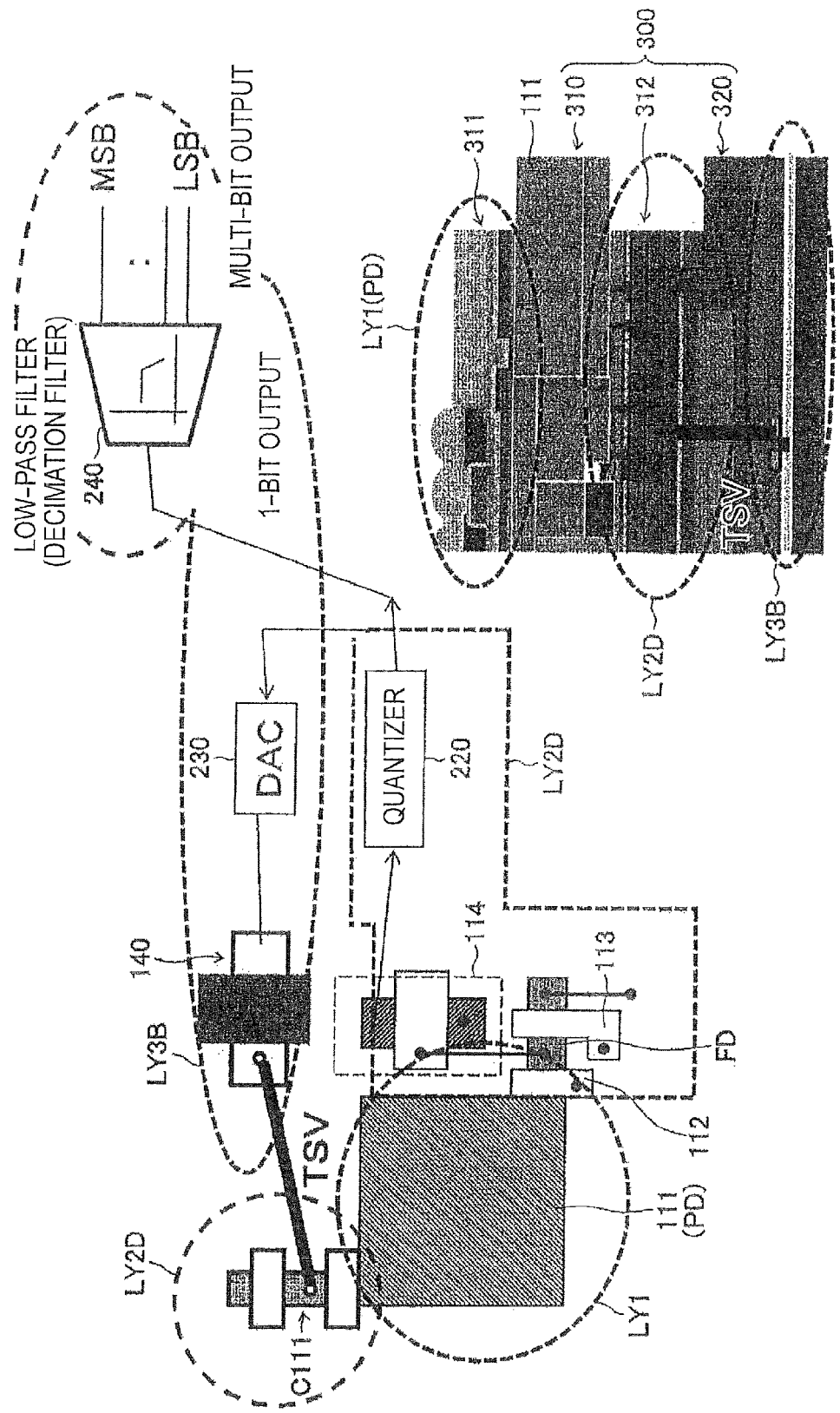
FIG. 15 is a diagram illustrating a seventh laminated structure example of the pixel circuit and the ΔΣ modulator (ΔΣ ADC).

FIG. 15 is a diagram illustrating a seventh laminated structure example of the pixel circuit and the ΔΣ modulator (ΔΣ ADC).

The example of FIG. 15 is different from the example of FIG. 14 in that the DAC 230 and the decimation circuit 240 formed in the lowest layer of the second substrate 320.

In this case, the output unit of the quantizer 220 on the front side 312 of the first substrate 310 and the diffusion layer of one of the source/drain of the transistor forming the input unit of the DAC 230 and the decimation circuit 240 are connected.

To simplify the drawing, only one transistor is illustrated in the lowest layer of the second substrate 320 in FIG. 15.

According to the present embodiment, as described above, the following effects can be obtained.

According to the present embodiment, the AD conversion by ΔΣ ADC (ΔΣ modulator) of multi-bit, for example, 16-bit high-speed imaging is enabled per pixel unit.

As a result, even a fine pixel of about 1 μm or less can support high-speed imaging.

Further, noise generated from a pixel can be compressed because of integration after feedback to the pixel.

In addition, even a fine pixel supports multi-bit high-speed imaging because of a three-dimensional LSI structure produced using a through via (TSV).

A solid-state image sensor having such advantageous effects can be applied as an imaging device in a digital camera or a video camera.

<5. Configuration Example of a Camera System>

Figure 16:
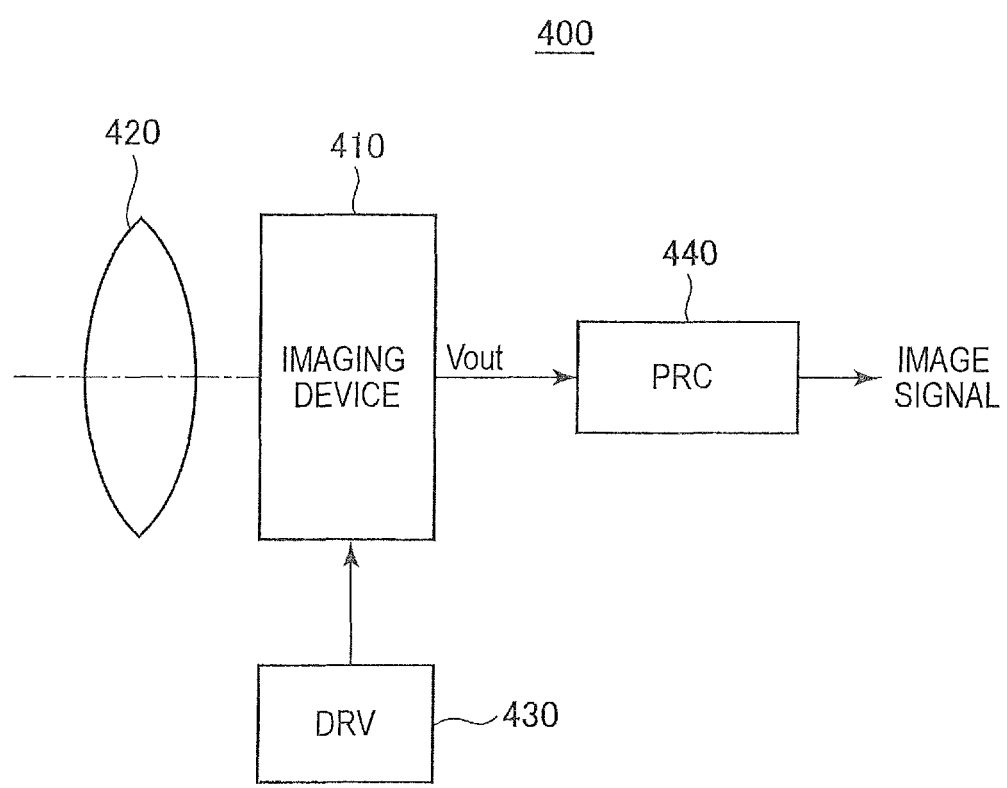
FIG. 16 is a diagram illustrating an example of a configuration of a camera system in which the solid-state image sensor according to the present embodiment is applied.

FIG. 16 is a diagram illustrating an example of a configuration of a camera system in which the solid-state image sensor according to an embodiment of the present disclosure is applied.

As illustrated in FIG. 16, a camera system 400 has an imaging device 410 that can apply the CVMOS image sensor (solid-state image sensor) 100 according to an embodiment of the present technology.

Further, the camera system 400 has an optical system that guides light incident on a pixel area of the imaging device 410 (forms an image of an object image), for example a lens 420 that forms an image on an imaging plane from incident light (image light).

The camera system 400 has a drive circuit (DRV) 430 for driving the imaging device 410 and a signal processing circuit (PRC) 440 for processing output signals from the imaging device 410.

The drive circuit 330 has a timing generator (not illustrated) that generates various timing signals including a start pulse and a clock pulse for driving the circuits in the imaging device 410. The drive circuit 430 drives the imaging device 410 based on a predetermined timing signal.

Further, the signal processing circuit 440 performs predetermined signal processing on the output signals from the imaging device 410.

The image signals processed by the signal processing circuit 440 are recorded on a recording medium such as a memory. The image information recorded on the recording medium is produced as a hard copy by printing, for example. Further, the image signals processed by the signal processing circuit 440 are displayed as moving images on a monitor configured from a liquid crystal display, for example.

As described above, a low power consumption, high accuracy camera can be realized by mounting the above-described solid-state image sensor 100 as an imaging device 410 in an imaging apparatus, such as a digital camera.

Additionally, the present technology may also be configured as below.

(1) A Solid-State Image Sensor Including:

a pixel array unit in which a plurality of pixels including a photo diode that converts an optical signal into an electric signal is arranged; and a reading unit that reads an image signal from the pixel, wherein the pixel includes an embedded photo diode, an amplification transistor forming a source follower circuit having a gate for input and a source for output, and a transfer transistor that transfers a charge to the gate of the amplification transistor, the charge being photoelectrically converted by the photo diode, wherein the amplification transistor is formed in a semiconductor substrate electrically isolated from a substrate on which the embedded photo diode and the transfer transistor are formed and the substrate of the amplification transistor is in a floating state, and wherein the reading unit includes a ΔΣ modulator that inputs/outputs the image signal per pixel unit and the output of the ΔΣ modulator is given, as feedback, to a capacitative unit functioning as a capacity to integrate the pixel.

(2) The Solid-State Image Sensor According to (1), wherein the pixels and the ΔΣ modulator are formed on different substrates and the substrates are laminated in a manner that a feedback path of the ΔΣ modulator and the capacitative unit of the pixel are electrically connected through a via.

(3) The Solid-State Image Sensor According to (2), wherein the ΔΣ modulator includes a quantizer that outputs at least an input signal as a digital signal, and a digital-analog converter (DAC) that is provided in the feedback path and converts the digital signal of the quantizer into an analog signal, and wherein the quantizer and the DAC are formed on a same substrate and output of the DAC and the capacitative unit of each of the pixels are connected by the via.

(4) The Solid-State Image Sensor According to (2), wherein the ΔΣ modulator includes a quantizer that outputs at least an input signal as a digital signal, and a digital-analog converter (DAC) that is provided in the feedback path and converts the digital signal of the quantizer into an analog signal, and wherein the quantizer and the DAC are formed on different substrates and output of the quantizer and input of the DAC are connected by the via.

(5) The Solid-State Image Sensor According to (3), wherein the ΔΣ modulator includes a decimation circuit that converts the digital signal of the quantizer into a multi-bit signal, and wherein the decimation circuit is formed on a same substrate as the quantizer and the DAC and output of the DAC and the capacitative unit of each of the pixels are connected by the via.

(6) The Solid-State Image Sensor According to (4), wherein the ΔΣ modulator includes a decimation circuit that converts the digital signal of the quantizer into a multi-bit signal, and wherein the decimation circuit is formed on a same substrate as the DAC and the output of the quantizer, the input of the DAC, and input of the decimation circuit are connected by the via.

(7) The Solid-State Image Sensor According to Any One of (1) to (6), wherein a switching transistor that is selectively turned on or turned off is connected between a feedback path of the ΔΣ modulator and the capacitative unit of each of the pixels.

(8) The Solid-State Image Sensor According to Any One of (1) to (7), wherein the capacitative unit of each of the pixels is a floating diffusion node on an input side of the amplification transistor of each of the pixels.

(9) The Solid-State Image Sensor According to Any One of (1) to (7), wherein the capacitative unit of the pixel is the embedded photo diode.

(10) A Camera System Including:
  a solid-state image sensor;
  an optical system that forms a subject image on the image sensor; and
  a signal processing circuit that processes an output image signal of the image sensor,
    wherein the solid-state image sensor includes
    a pixel array unit in which a plurality of pixels including a photo diode that converts an optical signal into an electric signal is arranged, and
    a reading unit that reads an image signal from the pixel,
    wherein the pixel includes
    an embedded photo diode,
    an amplification transistor forming a source follower circuit having a gate for input and a source for output, and
    a transfer transistor that transfers a charge to the gate of the amplification transistor, the charge being photoelectrically converted by the photo diode,
    wherein the amplification transistor is formed in a semiconductor substrate electrically isolated from a substrate on which the embedded photo diode and the transfer transistor are formed and the substrate of the amplification transistor is in a floating state, and
    wherein the reading unit includes a ΔΣ modulator that inputs/outputs the image signal per pixel unit, and the output of the ΔΣ modulator is given, as feedback, to a capacitative unit functioning as a capacity to integrate the pixel.

REFERENCE SIGNS LIST 100 solid-state image sensor
110 pixel array unit
110a pixel circuit
111 photoelectric conversion element
112 transfer transistor
113 reset transistor
114 amplification transistor
115 select transistor
120 row selection circuit (pixel drive unit)
130 column reading circuit
140 switching transistor
200 ΔΣ modulator (ΔΣ adc)
210 integrator
220 quantizer
230 dac
240 decimation circuit
400 camera system
410 imaging device
420 drive circuit
430 lens (optical system)
440 signal processing circuit

The invention claimed is:

1. An imaging device comprising:
  a first substrate including:
    a pixel including:
      a photoelectric conversion element configured to convert an optical signal into an electric signal;
      a transfer transistor configured to transfer the electric signal;
      a floating diffusion configured to hold the electric signal;
      an amplifying transistor;
      a quantizer; and
      a digital-analog converter; and
  a second substrate including a feedback transistor, wherein a first current terminal of the transfer transistor is connected to the floating diffusion and a second current terminal of the transfer transistor is connected to the photoelectric conversion element, a control terminal of the amplifying transistor is connected to the floating diffusion, a first current terminal of the feedback transistor is connected to the digital-analog converter and a second current terminal of the feedback transistor is connected to the floating diffusion, and the first substrate and the second substrate are laminated.

2. The imaging device according to claim 1, wherein the photoelectric conversion element is formed on a back side of the first substrate and the quantizer, and the digital-analog converter is formed on a front side of the first substrate.

3. A camera system comprising:
  an imaging device comprising:
    a first substrate including:
      a pixel including:
        a photoelectric conversion element configured to convert an optical signal into an electric signal;
        a transfer transistor configured to transfer the electric signal;
        a floating diffusion configured to hold the electric signal;
        an amplifying transistor;
        a quantizer; and
        a digital-analog converter; and
    a second substrate including a feedback transistor, wherein a first current terminal of the transfer transistor is connected to the floating diffusion and a second current terminal of the transfer transistor is connected to the photoelectric conversion element, a control terminal of the amplifying transistor is connected to the floating diffusion, a first current terminal of the feedback transistor is connected to the digital-analog converter and a second current terminal of the feedback transistor is connected to the floating diffusion, and the first substrate and the second substrate are laminated.

4. The camera system according to claim 3, wherein the photoelectric conversion element is formed on a back side of the first substrate and the quantizer, and the digital-analog converter is formed on a front side of the first substrate.

* * * * *